US007132129B2

(12) United States Patent
van Enckevort et al.

(10) Patent No.: US 7,132,129 B2
(45) Date of Patent: Nov. 7, 2006

(54) METHOD OF FORMING A DIAMOND COATING ON AN IRON-BASED SUBSTRATE AND USE OF AN IRON-BASED SUBSTRATE FOR HOSTING A CVD DIAMOND COATING

(75) Inventors: Wilhelmus Johannes Jacobus van Enckevort, Blerick (NL); Johannes Jacobus Schermer, Nijmegen (NL); Josephus Gerardus Buijnsters, Nijmegen (NL); Prabhakaran Shankar, Kalpakkam (IN); Johannes Joseph ter Meulen, Nijmegen (NL)

(73) Assignee: Stichting voor de Technische Wetenschappen, Utrecht (NL)

( * ) Notice: Subject to any disclaimer, the term of this patent is extended or adjusted under 35 U.S.C. 154(b) by 0 days.

(21) Appl. No.: 10/931,795

(22) Filed: Aug. 31, 2004

(65) Prior Publication Data

US 2005/0064097 A1    Mar. 24, 2005

Related U.S. Application Data

(63) Continuation of application No. PCT/NL03/00160, filed on Mar. 3, 2003.

(30) Foreign Application Priority Data

Mar. 1, 2002   (EP)   .................................. 02075815
Nov. 28, 2002  (EP)   .................................. 02080001

(51) Int. Cl.
    *C23C 16/00*   (2006.01)
(52) U.S. Cl. .................. 427/249.5; 427/249.8; 427/248.1; 148/217

(58) Field of Classification Search ............. 427/249.1, 427/249.8, 255.22, 255.38, 249.5, 248.1; 148/217
See application file for complete search history.

(56) References Cited

U.S. PATENT DOCUMENTS 3,634,145 A  *  1/1972  Homan ....................... 148/242

(Continued)

FOREIGN PATENT DOCUMENTS

EP           0 320 657 B1     9/1993

(Continued)

OTHER PUBLICATIONS

Baranauskas et al., Structural Properties if diamond-like carbon grown on stainless steel blades, Thin Solid Films, 2001, pp. 255-259, 398-399.

(Continued)

*Primary Examiner*—Timothy Meeks
*Assistant Examiner*—Howard Abramowitz
(74) *Attorney, Agent, or Firm*—TraskBritt

(57) ABSTRACT

A method of forming a diamond coating on an iron-based substrate, comprising: providing an iron based substrate with an outer layer which substantially comprises metal borides; and depositing the diamond coating on the outer layer using a process of Chemical Vapor Deposition (CVD). An outer layer may be formed by deposition, by depositing a metal layer which is capable of being boronized followed by boronizing the metal layer, or by boronizing the iron-based substrate. The invention is also related to the use of an iron-based substrate comprising an outer layer with borides for hosting a CVD diamond coating.

18 Claims, 2 Drawing Sheets

U.S. PATENT DOCUMENTS

| | | | | |
|---|---|---|---|---|
| 4,734,339 | A | * | 3/1988 | Schachner et al. .......... 428/701 |
| 5,022,933 | A | * | 6/1991 | Brandis et al. ............. 148/217 |
| 5,082,512 | A | * | 1/1992 | Futamura et al. .......... 148/330 |
| 5,624,719 | A | * | 4/1997 | Tanabe et al. .............. 427/577 |
| 5,759,623 | A | * | 6/1998 | De Mello Borges et al. ....................... 427/249.8 |
| 6,245,162 | B1 | | 6/2001 | Baudis et al. |
| 6,287,682 | B1 | * | 9/2001 | Grab et al. ................. 428/336 |

FOREIGN PATENT DOCUMENTS

| | | |
|---|---|---|
| EP | 0 984 077 A1 | 8/2000 |
| JP | 02055297 A * | 2/1990 |
| WO | WO 99/31292 | 6/1999 |
| WO | WO 03/074758 A1 | 9/2003 |

OTHER PUBLICATIONS

Borges et al., Influence of nitrided and carbonitrided interlayers on enhanced nucleation of diamond on stainless steel 304, Diamond and Related Materials, 2001, pp. 1983-1990, 10.

Kreines et al., Fretting wear of thin diamond films deposited on steel substrates, Diamonds and Related Materials, 2003, pp. 1731-1739, 13.

Schwarz et al., High temperature diffusion chromizing as a successful method for CVD-diamond coating of steel, Diamond and Related Materials, 2002, pp. 757-762, 11.

Schwarz et al., High temperature diffusion chromizing as a successful method for CVD-diamond coating of steel-Part II, Diamond and Related Materials, 2003, pp. 701-706, 12.

Shang et al., Effect of ion beam nitriding on a diamond nucleation and growth onto steel substrates, Diamond and Related Materials, 2001, pp. 1506-1510, 10.

Silva et al., A new interlayer approach for CVD diamond coating of steel substrates, Diamond and Related Materials, 2004, pp. 828-833, 13.

Silva et al., Microwave plasma chemical vapour deposition diamond nucleation of ferrous substrates with Ti and Cr interlayers, 2002, pp. 1617-1622, 11.

Silva et al., Tribological behaviour of CVD diamond films on steel substrates, WEAR, 2003, pp. 846-853, 255.

Silva et al., Unstressed PACVD diamond films on steel pre-coated with a composite multilayer, Surface and Coating Technology, 2004, pp. 1-6.

PCT International Search Report, PCT/NL03/00160, dated May 22, 2003.

PCT International Preliminary Examination Report, PCT/NL03/00160, dated Mar. 1, 2002.

Murakawa et al., The possibility of coating cubic BN film on various substrates, Database Inspec Online! Institute of Electrical Engineers, XP-002240016.

Tsujikami et al., Design of diamond gradually-dispersed material by FEM, Database Inspec 'Online! Institute of Electrical Engineers, XP-002240017.

Ralchenko et al., Thermal stress in diamond films, Database Inspec 'Online! Institute of Electrical Engineers, XP-002240019.

Borisov et al., Structure and properites of gas-thermal coatings of Fe-B-C and Fe-Ti-B-C alloys, Database Inspec 'Online! Institute of Electrical Engineers, XP-002240018.

* cited by examiner

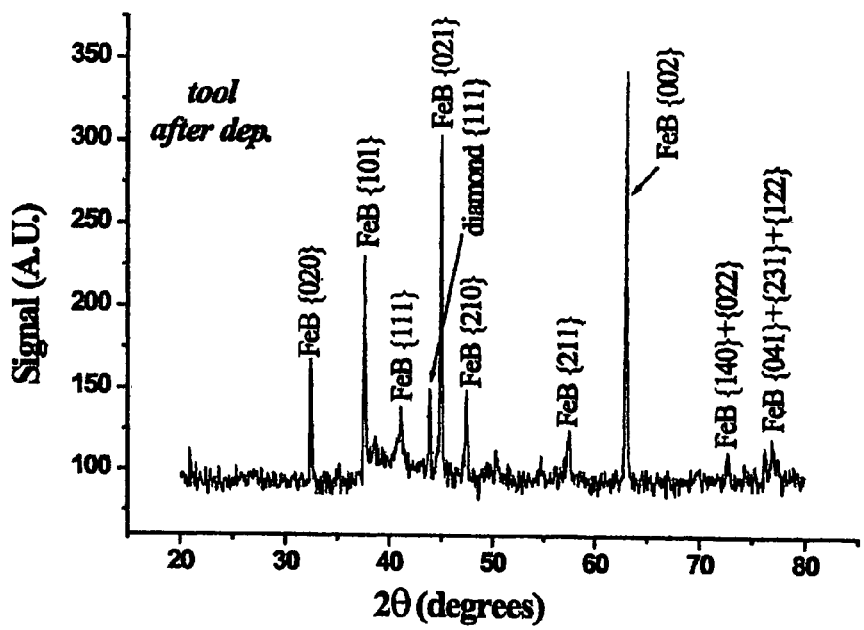
Fig. 2C
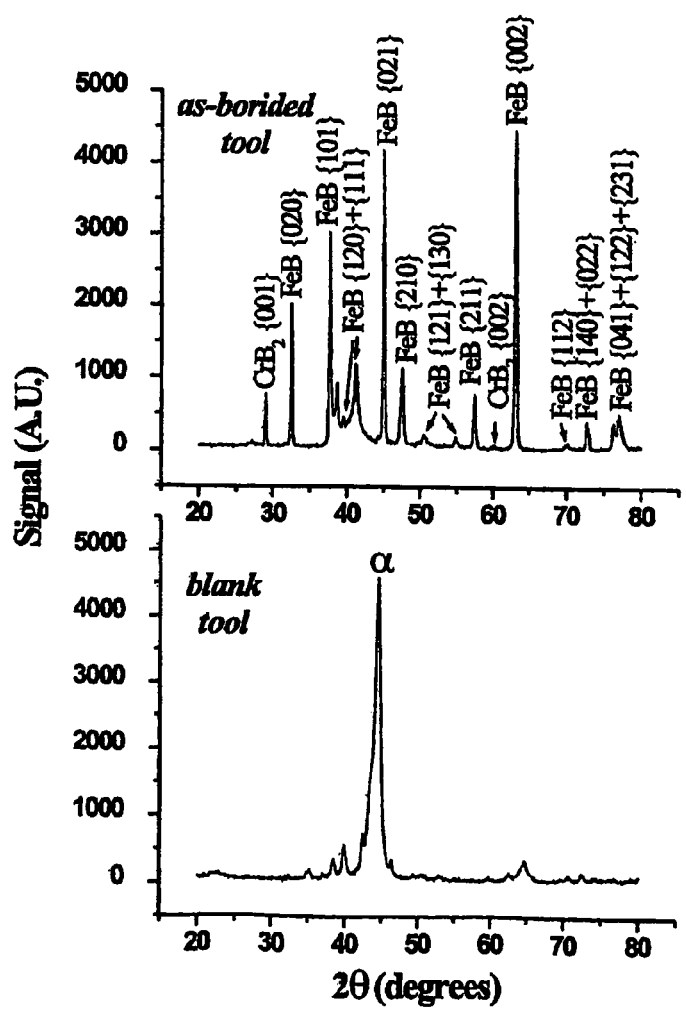
Fig. 2B
Fig. 2A

METHOD OF FORMING A DIAMOND COATING ON AN IRON-BASED SUBSTRATE AND USE OF AN IRON-BASED SUBSTRATE FOR HOSTING A CVD DIAMOND COATING

CROSS-REFERENCE TO RELATED APPLICATION

This application is a continuation of PCT International Patent Application No. PCT/NL/03/00160, filed on Mar. 3, 2003, designating the United States of America, and published, in English, as PCT International Publication No. WO 03/074758 A1 on Sep. 12, 2003, the contents of the entirety of which is incorporated by this reference.

TECHNICAL FIELD

The invention relates to a method of forming a diamond coating on an iron-based substrate and to the use of a particular iron-based substrate for a diamond coating.

BACKGROUND

Such a method is known from U.S. Pat. No. 5,759,623 which discloses a pretreatment step of supersaturating an iron-based surface with carbon prior to the deposition of a diamond coating. The deposition involves a Chemical Vapor Deposition (CVD) process.

For a relatively long time it has been known how to deposit from a gas phase a polycrystalline diamond coating on a selected substrate. The substrate is exposed to a gas mixture comprising at least a carbonaceous compound which is activated. Often methane is used together with hydrogen in such a gas mixture. The activation of the gas mixture generally requires severe conditions such as high gas temperatures of well above 2000° C. or microwave radiation. The substrate is generally kept at an elevated temperature (typically 900° C.) and comprises a well chosen ceramic such as silicon or a relatively expensive metal such as molybdenum.

Given the superior properties of diamond in terms of hardness, wear resistance, and chemical stability, it is advantageous to apply a CVD diamond coating to substrates which are in use exposed to severe conditions.

PCT International Publication No. WO 99/31292 and EP 0 984 077 both disclose a cemented carbide or tungsten carbide (WC)-based hard metal substrate onto which a CVD diamond coating has been deposited. Such substrates are relatively expensive.

EP 0 320 657 describes a method for coating metal substrates with CVD diamond. Such substrates include refractory metals, such as Rhenium, Tantalum and Tungsten onto which diamond deposition without the use of an interlayer has been shown to be possible. Also these substrates are relatively expensive.

Given the many applications of iron and steel and the relatively low price of iron and steel, it is desirable to have a CVD diamond coating on a steel or iron substrate. Such a combination of a coating and a substrate will provide a cost-effective substitute for tools fabricated out of materials such as cemented carbides which are often used in industrial applications. The CVD process that is used in the present invention, is a particular suitable way of applying diamond and is well documented. See for example: "CVD diamond films: nucleation and growth"; S.-Tong Lee, Zhangda Lin and Xin Jiang, Materials science and Engineering R (Reports: A review journal), 25 (1999) 123–154, which document is incorporated herein by reference to provide process equipment and process conditions for the CVD process used in the process of the invention.

However, as said, during the CVD process the substrate temperature is kept at a high temperature. Within a temperature range from this high temperature down to room temperature there is a very high difference in thermal expansion coefficient between iron or steel and diamond. This leads to high interface stresses during cooling down from the deposition temperature. As a result, the coating may delaminate from the surface or give rise to other disadvantageous effects.

It is for instance possible that the coating only partly delaminates at patches on the interface, therewith releasing stress and reducing adherence to the substrate.

If a coating remains completely attached to the surface, the interface stress within the coating can be enormously high enhancing the likelihood that the coating will delaminate during subjection to practical applications.

The residual stress in a coating can be measured as indicative of the interface stress. Ideally, the deposition process results in a continuous diamond coating with a low residual stress. In practice, this has proven to be a difficult task.

Apart from stress related problems, the deposition of diamond on iron-based substrates and especially steel is hampered by the fact that materials containing iron phases at the surface favor at deposition conditions formation of graphite instead of formation of diamond. This, of course further inhibits formation of a well adhering diamond coating on steel. Moreover, the high solubility of carbon in iron phase containing substrates appears to hinder formation of CVD diamond coating.

In attempts to solve these problems, interlayer systems have been developed with attempts to 1) suppress diffusion of iron to the substrate surface, 2) suppress diffusion of carbon into the iron phase, and 3) accommodate for and/or reduce the high interface stresses.

Reports have been published on the use of overlay coatings, which are deposited on top of the steel substrates prior to CVD diamond deposition. These overlay coatings may have a thickness of the order of several micrometers and are mainly produced by Physical Vapor Deposition (PVD) techniques. Some examples involve the use of molybdenum, nickel, titanium nitride and chromium nitride interlayers.

None of these overlay coatings have been proven to be very successful as an abrupt change in the elastic, thermal and/or mechanical properties is present at the interface with the deposited diamond coating. These changes lead to high interface stresses, which often result in delamination during cooling down from deposition temperature and if not, ultimately to premature failure during use in industrial applications. Also the interlayer/steel interface is abrupt, enhancing the likelihood of failure of this layer system at a depth further away from the diamond coating.

In a further attempt to overcome at least some of these problems, a diffusion modified overlay coating has been employed. Hereto, a chromium layer was deposited on a steel substrate by means of electroplating and this chromium layer was subsequently nitrided by passing a gas mixture comprising nitrogen. Also applying a chromium layer to a steel substrate subsequently followed by diffusion of the chromium into the steel has resulted in a interlayer which allows for CVD diamond coating of steel as reported by.

This approach has within the overlay coating resulted in—towards the iron-based substrate—gradually changing properties such as elasticity, hardness and thermal expansion of the material, leading to a slightly better accommodation of the thermal stress during the CVD diamond deposition process. However, there remains a large mismatch in the thermal and mechanical properties at the interface of a diamond coating and the substrate surface, as well as an abrupt change in properties at the chromium/steel interface introducing weak interfaces in the layer system. Also very high residual stresses (indicative of high interface stresses) have been observed within the diamond films deposited on this layer system, limiting the scope of applications.

It should further be noted that this method of producing an interlayer system includes three steps for obtaining a CVD diamond coating on steel. Each step is carried out in a different reactor, making the method complicated and costly. These steps are: 1) electroplating, 2) nitriding and 3) depositing diamond.

High temperature diffusion chromizing as a successful method for CVD-diamond coating of steel by S. Schwarz et al. in Diamond and Related Materials 11 (2002) 757–762.

Previously identified U.S. Pat. No. 5,759,623 discloses supersaturation of an iron based substrate with carbon by heating the substrate and exposing it to a carbon atom donor substance. It is suggested that by in-diffusion of carbon a diffusion barrier is formed in the iron based substrate. A black carbon deposit is formed on the surface of the substrate and after removing this deposit the substrate is suitable for diamond to be deposited on the surface thereof.

However, at least the following two problems remain. During the CVD process, carbon already present in the iron-based substrate diffuses further away from the surface, thereby slowly dissolving the diffusion barrier at a side adjacent to the matrix of the iron-based substrate. This allows for more iron to diffuse to the surface, hampering the formation of diamond during deposition. Iron may also catalytically aid the transformation of diamond to the more stable form of graphite. A further detrimental result of the presence of iron at the interface with the diamond coating that may occur is premature delamination of the diamond coating in use due to conditions where the diamond coating is subjected to heat. Another problem is that a large mismatch in properties is still present between diamond and the surface of the supersaturated iron based substrate. The Vickers hardness of carburized steel surfaces is reported to be about 1,000, whereas the diamond grains themselves have a VHN (VHN=Vickers Hardness Number) of 10,000.

DISCLOSURE OF THE INVENTION

Provided is a method of forming a diamond coating on an iron-based substrate, which is improved with respect to methods known of the prior art, or at least, solves one or more of the problems known in the art. Further advantages of the process of the present invention will become clear when reading the description herein-below.

The present inventors have found that a specific outer surface layer of an iron based substrate allows for deposition of a diamond coating.

More in detail, the present invention relates to a method of forming a diamond coating on an iron-based substrate, comprising the steps of:
  providing an iron based substrate with an outer layer which substantially comprises metal borides; and
  depositing the diamond coating on the outer layer using a process of Chemical Vapor Deposition (CVD).

Within this specification and the appending claims, the outer layer is understood to be an intentionally produced layer which is different from the matrix of the unaffected iron based substrate.

With "an outer layer which substantially comprises metal borides" is meant an outer layer of which the X-ray diffraction pattern reveals phases of metal borides, preferably in a significant amount. It is preferred that the metal borides comprise iron borides in a significant amount. This allows for the possibility of producing an outer layer without an abrupt change in composition with the iron-base substrate. The carbon solubility of such metal borides is negligibly small. X-ray diffraction patterns of the outer layer obtained after exposure of the outer layer to a carbonaceous material under diamond deposition conditions show that no significant carburization of the outer layer occurs prior to diamond nucleation. Without wishing to be bound by any theory, it is believed that these metal borides act as an effective diffusion barrier for carbon. In accordance with the present invention, this allows for the use of an iron based substrate with such an outer layer for hosting a CVD diamond coating. Raman spectroscopy has shown that good quality diamond is grown on the outer layer after exposure to CVD diamond conditions. From the position of the first order Raman diamond peak it also follows that, compared to residual stress in CVD diamond coatings deposited on the outer layers known of the prior art, the CVD diamond coatings deposited on the outer layers substantially comprising borides show relatively little residual stress. Furthermore, the diamond coatings are found to be adherent to the outer layer which substantially comprises metal borides. The thickness of the outer layer is likely to be in the order of a micrometer or more, although a thinner layer is not thought to be impossible. Those skilled in the art will easily find for each particular combination of substrate and diamond coating a suitable thickness of the outer layer.

BRIEF DESCRIPTION OF THE FIGURES

FIG. 2a–2c shows X-ray diffraction patterns taken of: an untreated substrate (FIG. 2a); an as-boronized substrate (FIG. 2b); and of an as-borided substrate on top of which a CVD diamond coating was deposited (FIG. 2c).

DETAILED DESCRIPTION OF THE INVENTION

Figure 1:
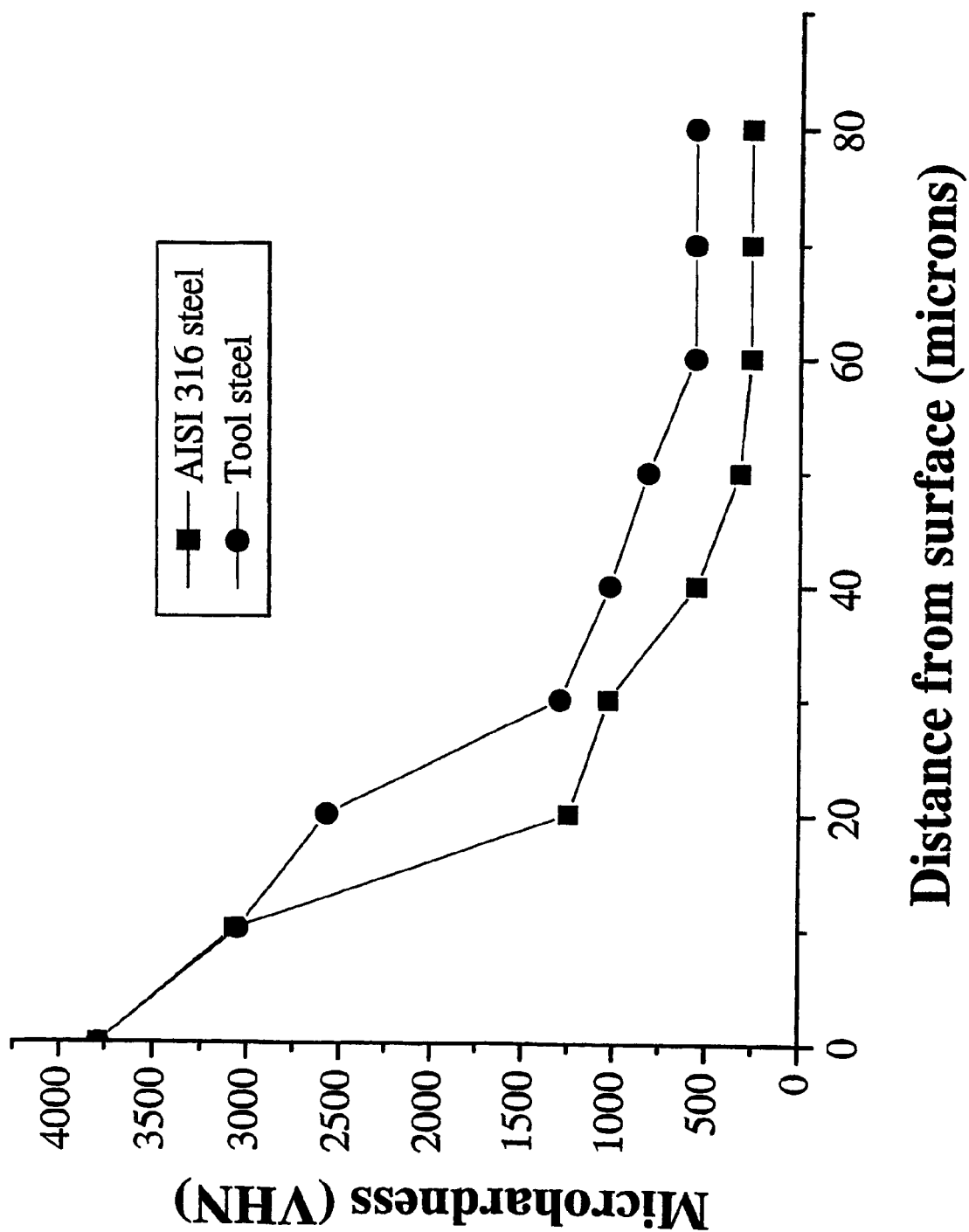
FIG. 1 shows typical microhardness profiles of the as boronized samples.

In one preferred embodiment of the method according to the invention, the outer layer is formed by deposition. Physical Vapor Deposition (PVD), for instance, allows for deposition of a metal boride. Using this method it is even possible to deposit an outer layer which gradually changes in composition from comprising, for instance, predominantly iron borides at the very surface of the outer layer to almost entirely a metal phase closer to the interface of the outer layer with the iron based substrate. With such an outer layer, the thermal and mechanical properties will vary from relatively close to the thermal and mechanical properties of the iron based substrate at the interface of the outer layer and the iron based substrate to relatively close to the thermal and mechanical properties of diamond at the very surface of the outer layer. This outer layer is much more suitable for accommodating residual stress which results after the deposition of diamond. To obtain such an outer layer, a metal boride source and a metal source may be employed in the PVD reactor. After being apprised of the instant disclosure, and for those skilled in the art, it is not a problem to find the process parameters which ensure deposition of this type of metal boride outer layer. It is also within the scope of the skilled artisan to obtain a desired thickness of this outer layer and a desired gradient in composition.

In another embodiment of the method according to the invention, the outer layer is formed by depositing a metal layer which is capable of being boronized followed by boronizing the metal layer. The metal layer may be deposited by electroplating, PVD, or any other suitable technique. Boronizing is a well known and a well documented technique and comprises the in-diffusion of boron in the metal layer. Hereto, the iron based substrate with the deposited metal layer is exposed to gaseous, liquid, or solid boron-yielding compounds at elevated temperatures. By this technique, a metal boride outer layer is formed onto which a CVD diamond coating can be deposited. It should be noted that in the field of boronizing for the same process is also commonly used the term "bonding".

In a more preferred embodiment of the method according to the invention, the outer layer is formed by boronizing the iron-based substrate. This embodiment only needs one step, the boronizing step, to form the outer layer which comprises metal borides. Furthermore, in comparison to outer layers obtained by PVD techniques, the boronizing steel surface will not suffer from shadow effects or require complicated reactors in which the steel substrate is, e.g. rotated, to obtain an outer layer on substrates with a complicated geometry. Boronizing an iron-based substrate prior to CVD diamond deposition provides a simple and relatively cheap method for obtaining an outer layer which is suitable for hosting a CVD diamond coating.

Boronizing is, as stated before, a well known technique. See for example: "Microstructural and Microchemical Modifications on Interrupted Boriding of Medium Carbon Steel, by P. Gopalakrishnan, P. Shankar, M. Palaniappa, S. S. Ramakrishnan, Accepted for publication in Metall. Mater. Trans. A, which accepted article is filed together with the present application.

In this technique, boron yielding compounds and the substrate are heated up to temperatures at which boron atoms become free from the boron yielding compounds and at which these boron atoms diffuse with a reasonable mobility into the matrix of the iron-based substrate. The state of the boron yielding compounds may be gaseous, liquid or solid.

As a gas, boron trifluoride, boron trichloride, or boron tribromide may be used, although their sensitivity to even the slightest traces of moisture have made these gases rather uncommon in the field. Diborane is also sensitive to moisture and is poisonous. Alternatives may be trimethyl boride and triethyl boride. In practice, the substrate usually is kept in an induction or a tube furnace through which the gases are led.

More preferable is the use of liquid compounds in molten salt. Boronizing can occur with and without electrolysis. Also aqueous solutions with high frequency heating are practised. Typically, compounds such as borax, anhydrous borax, metaboric acid, sodium borofluoride, boric acid anhydride and boron carbide are used for boronizing methods involving electrolysis. The substrate is suitably cathodically connected in molten borax, while a graphite bar serves as an anode. However, in this method the boronized layer thickness is often difficult to control. A more preferred method involves therefore electroless boronizing wherein low cost chemicals such as borax and boric acid, are reduced with ferroboron, ferrosilicon, or ferrosilicon magnesium. Activators such as sodium fluoride or sodium chloride are often added.

An even more preferred boronizing method involves the use of solids in powder or paste form. Advantages are easy handling, the possibility of changing the composition of the powder and the need for very little equipment, keeping costs low. The so-called pack boronizing, wherein the substrate is packed in powder or (partially) in paste and thoroughly warmed in a chamber furnace is especially attractive with regard to the purpose of the invention. Various mixtures of boron carbide and for instance potassium fluoroborate may be used. Also amorphous boron or ferroboron and an activator may be applied. In the process of boronizing not only boron may diffuse into the iron phase of the iron based substrate, but also other elements which are present in the gas, liquid or solid compounds, to which the iron based substrate is exposed, may diffuse into the matrix. Especially, elements such as chromium, titanium, aluminum, zirconium and vanadium may intentionally be used for this purpose. This process is referred to as a multiple component boronizing process. The borides formed with these elements may have advantageous properties in terms of the microstructure obtained by this process and the mechanical properties following from these microstructures. Those skilled in the art will be able to apply this particular method with benefit to the purpose of the invention.

With any of these boronizing processes it is possible to obtain an outer layer in which boron is incorporated to an extract that solution boron in the matrix is no longer possible, leading to formation of iron borides (FeB and $Fe_2B$). Boron may at the very surface at least locally reach concentrations of 30–50 at %. This highly boron enriched iron based surface seems to act as a diffusion barrier for both iron and carbon and seems to suppress the formation of graphite during the deposition of diamond. The concentration of boron in the outer layer drops gradually off with larger depths from the surface towards no more than anyway present in the unaffected matrix of the iron-based substrate. The structure of the outer layer usually comprises more towards the matrix of the iron based substrate, a combination of phases of FeB and $Fe_2B$, followed by $Fe_2B$ and/or an iron base matrix with an enhanced concentration of boron as compared to the concentration of boron in the iron based substrate before boronizing took place. Also borides of elements which are in the iron-based substrate used as alloying elements may be present. As a consequence of the changing boron concentration, also the mechanical properties change with the depth from the surface of the outer layer. At the very surface the properties are closer to the properties of diamond and the larger the depth from the surface, the closer the properties of the outer layer approach the properties of the unaffected matrix of the iron based substrate.

As a property such as the hardness gradually tails off from the diamond/outer layer interface to a certain depth from the substrate surface, the diffusion modified iron substrate acts as a kind of buffer zone between the diamond and the unaffected matrix of the iron based substrate. This allows for accommodation of the thermal stress which is generated during cooling down the iron based substrate with the CVD diamond coating from the deposition temperature.

In an even more preferred embodiment a surface of the outer layer comprises $Fe_2B$ and is substantially free from FeB. It is within the scope of the man skilled in the art to produce the outer layer such that formation of FeB is avoided and that the surface will substantially comprise $Fe_2B$. Suitable control of the boron activity determines the formation of either a combination of FeB and Fe$_2$B phases or predominantly Fe$_2$B phases. The formation of FeB is believed to enhance the thermal stress after cooling down the iron-based substrate with a freshly deposited CVD diamond coating as the thermal expansion coefficient of FeB is about 25 times the thermal expansion coefficient of diamond. Fe$_2$B on the other hand, has a thermal expansion coefficient about three times smaller than the thermal expansion coefficient of FeB.

It is even more preferred, that the outer layer is substantially free from FeB. In cases wherein the outer layer is formed by boronizing solid metal layer or the iron-based substrate, involving the use of solids in powder or paste form, formation of FeB is avoided by using 5% B$_4$C in a boriding mixture instead of using 8% B$_4$C.

By reducing the thermal expansion coefficient between the surface of the outer layer and the diamond coating, the thermal stresses resulting from the cooling down of the substrate and the as-grown diamond coating from deposition temperatures, will be reduced. Hence, reduction of the amount of FeB in the outer layer means further improving the thermo-mechanical properties of the layer between diamond and the iron-based substrate.

The thickness of these outer layers is usually at least one micron. Thicknesses may be up to about 70–80 microns. The volume percentage of Fe$_2$B at the surface of the outer layer is generally in the order of about 50 vol. % and preferable at least 80 vol. %. However, it is possible to obtain adherent diamond films, on surfaces with less than 50 vol. % Fe$_2$B. These percentages follow from estimations based on relative intensities of X-ray diffraction peaks in a pattern obtained from the surface of the outer layer. These estimations have not been corrected for differences in atomic scattering factor between Fe and B. It should be noted that these percentages may also be different if a highly alloyed Fe-based substrate is used.

According to a further preferred embodiment, the boronizing is carried out at a relatively high temperature at which the iron-based substrate comprises a stable austenite phase. This allows for a reasonably fast boronizing process. For austenitic steels this rapid in-diffusion is simply due to the raised temperature enhancing the speed of a thermally driven process. In addition to this temperature effect, ferritic steels will experience a phase transformation into the austenitic structure, which is an advantage as the diffusivity of boron in austenite is at elevated temperatures about twice the diffusivity of boron in ferrite.

It is further preferable that boronizing is alternated by annealing. With the term "annealing" is meant keeping the substrate with the outer layer on a temperature at which it is possible that the structure minimizes its internal strain energy. Ideally, the annealing occurs at a temperature lower than the temperature at which boronizing takes place. For ferritic steels this would preferably occur at a temperature below the temperature at which both austenite and ferrite are stable. For instance, the solubility of carbon in borides is negligibly low. The presence of carbon is believed to slow down the boronizing process. By annealing, that is dropping the temperature, the in-diffusion of boron will almost stop. It is believed that at the annealing temperature the carbon atoms get an opportunity to diffuse away from the borides into the matrix of the iron phase which has a higher carbon solubility than the borides. After all, the diffusivity of boron in ferritic mild steel is, at for example 650° C., about four orders of magnitude lower than the diffusivity of carbon in ferrite. This allows in a relatively short time span for diffusion of carbon away from the borides, therewith usually also minimizing lattice strain. By repeating this cycle of boronizing and annealing, an outer layer with a boride structure which is suitable for hosting a CVD diamond coating is obtained.

Microstructural analysis of an austenitic steel and a ferritic steel which have been subjected to cycles of boronizing and annealing has revealed for both substrates a 40–50 micrometer thick borided layer. The XRD patterns of the boronized steel layers showed the presence of FeB, and Fe$_2$B. The Vickers hardness of both surfaces of the outer layer appeared to be up to 3800 VHN, a significant improvement as compared to surface of nitrided and carburized iron based substrates with Vickers hardness up to around 1000 VHN. Hardness measurements taken along a line from the surface of the outer layer towards the matrix of the steel substrates, show that the further the measurement is from the surface of the outer layer, the lower the hardness is and the closer the hardness lies near the hardness of the matrix of steel (260 VHN for the austenitic steel and 550 VHN for the ferritic steel). This gradual drop in hardness allows the boronized steel surface to be a good hosting substrate for CVD diamond. The number of cycles of boronizing and annealing, the timespans during which is boronized and during which is annealed, and the temperatures at which is boronized and at which is annealed form parameters by which the thickness, microstructure, hardness and so forth are controlled.

It is further preferable that the method comprises
heating the iron-based substrate which comprises subjecting the outer layer to an elevated temperature which is within a range of 135° C. to 1200° C.;
exposing the iron-based substrate which comprises subjecting the outer layer to a gas mixture containing a carbonaceous gas;
activating the gas mixture.

This offers a wide scope of parameters for the CVD diamond deposition process. The lower the elevated temperature of the iron-based substrate which comprises the outer layer, the lower the thermal stress generated upon cooling down from deposition temperature and the lower the growth rate of the coating. For a thin coating this is no problem. A low temperature of the iron-based substrate during CVD diamond deposition may also be preferred in order to avoid major structural changes in the matrix. As post deposition machining of the diamond coating is undesired if not impossible, the substrate temperatures are kept low during CVD diamond deposition to remain the narrow tolerances in dimensions. This is particularly important in cases where the diamond coating is applied to precision tools. The gas mixture may comprise the gas mixtures commonly used in the different reactors known to be suitable for CVD diamond deposition. Methane and hydrogen are suitable for a Hot Filament Reactor and for instance acetylene and oxygen are suitable for a Flame Reactor. Activating the gas mixture is carried out by the methods commonly used in a reactor selected out of the group consisting of, a hot filament reactor, a flame reactor, an arc-jet reactor and any plasma activated reactors such as a microwave reactor and a radio frequency activated reactor.

In a further preferred embodiment of a method according to the invention the gas mixture comprises initially an excess of carbonaceous gas to allow for a reduction of an incubation time for nucleation of diamond crystallites. This ensures sufficient coverage of the surface of the outer layer to obtain a diamond coating which is fully adherent to the outer layer.

Furthermore, by providing many small diamond crystallites close to the interface of the diamond coating and the outer layer of the iron based substrate, the coating will inherently contain a large volume fraction of grain boundaries. Often the grain boundaries comprise forms of carbon which are less dense than diamond. For that reason the grain boundaries are much better capable of dealing with the residual stress in the diamond coating after cooling down from the deposition temperature.

Also methods known as bias enhanced nucleation may be applied to obtain such a coating with many small diamond crystallites. In this method the substrate is biased with respect to for instance the feed-in passage of the gas mixture of the reactor.

So-called nanocrystalline diamond coatings comprising diamond crystallites with dimensions in the order of nanometers or some tens of nanometers may also easily be formed by those skilled in the art.

After depositing a diamond coating with small crystallites the growth conditions may be changed such that growth of the diamond crystallites is favored over the nucleation of diamond crystallites. Hereto, the excess of carbonaceous gas is reduced with respect to the excess used in the preliminary stages of CVD diamond deposition.

Those skilled in the art of diamond deposition will be capable of optimizing the deposition parameters to obtain diamond coatings with desired characteristics. These parameters comprise, the pressure in the reactor, the substrate temperature, the gas concentration, the gas flow rate, the activation means and various other parameters related to the activation means. The characteristics comprise grain size, surface morphology, and the contributions of forms of carbon which are less dense than diamond.

In a further preferred embodiment, the method according to the invention comprises after depositing the diamond coating on the outer layer a step of controlled cooling down the iron-based substrate with the outer layer and the diamond coating at a controlled cooling rate which is slower than the cooling rate obtained by uncontrolled cooling. Preferably, the iron-based substrate with the outer layer and the diamond coating are cooled down at a cooling rate of 20° C. or less per minute.

Without wishing to be bound by theory, it is believed that the advantage of this step is that at such a slow cooling rate there is still time to redistribute atoms within the structure of the outer layer and/or within the iron based substrate, therewith minimizing the thermal stress. As a result the likelihood that a diamond coating delaminates from the iron based substrate during cooling is believed to be reduced. Also the likelihood that the diamond coating delaminates during practical use is reduced.

In a further advantageous embodiment of the method according to the invention, the outer layer is mechanically scratched prior to depositing the diamond coating. This may lead to better adhesion of the deposited diamond coating due to an enhanced roughness of the surface. Fine grains, with dimensions in the order of one or some micrometers may be used for scratching the outer layer. Preferably, grains are used with a hardness higher than the hardness of the outer layer. Even more preferably, cubic boron nitride grains and/or diamond grains are used as in that case small fragments of the cubic boron nitride and/or the diamond may be embedded in the outer layer and form sites where hetero-epitaxial or homo-epitaxial growth of diamond can take place. This enhances the nucleation rate of the CVD diamond process.

Those skilled in the art of CVD diamond deposition will apply well known cleaning procedures of the substrate and outer layer before depositing CVD diamond. These cleaning procedures may be combined with ultrasonic abrasion. In such a process the substrate with the outer layer is ultrasonically abraded for some or some tens of minutes in a solution comprising fine powder of a material with a hardness which is higher than the hardness of the outer layer. Also in this case, for the same reason as stated above, cubic boron nitride and/or diamond may be used. A solution comprising 0.25 grams of diamond powder (1–2 micrometer) in 20 milliliter of isopropanol may be applied in this step. After ultrasonically abrading the outer layer of the substrate properly cleaning and drying is generally applied.

It should further be borne in mind that the thickness of the diamond coating can easily be controlled by parameters which influence the nucleation rate and/or growth rate. A very thin coating is often referred to as a film. A film may be used in applications where a low friction coefficient of the surface of the diamond coating is required. A thick coating may be used in application where the properties related to wear resistance are of importance. In general, it should be borne in mind that the lower the residual stress in the diamond coating, the thicker the coating can be without meeting negative effects. The thickness of the diamond coating may also depend on the specific type of iron based substrate. Steels with a relatively low thermal expansion coefficient within the relevant temperature ranges may allow for a thicker diamond coating.

Those skilled in the art may easily find a suitable combination of type of steel or other iron-based substrate, method of providing the outer layer and the desired characteristics of the diamond coating.

The present invention will now be further illustrated while referring to the following, non-limiting examples.

EXAMPLE 1

A ferritic tool steel with a matrix Vickers hardness of 550 is boronized by a packed boronizing process. Hereto is a mixture of boron carbide, silicon carbide and potassium fluorocarbide used. Boronizing is carried out at a temperature of 950° C. for 1 hour and alternated by annealing for about 15 minutes at a temperature of 650° C. just under the temperature at which both austenite and ferrite are stable. This cycle of boronizing and annealing is carried out four times after which the tool steel substrate is cooled down in air.

X-ray diffraction investigations show the presence of significant amounts of $Fe_2B$ and $CrB_4$ and small concentrations of FeB. SEM investigations show the presence of an outer layer of about 40–50 μm thick with needle shaped borides. Also a high fraction of interdendritic spherical boride particles is observed. Such a microstructural state generally results from a boron concentration which decreases from the surface of the outer layer towards the matrix. Also chromium boride phases are distributed uniformly as fine precipitates within the iron boride layer. The Vickers hardness drops from about 3780 VHN at the surface of the boronized outer layer to about 2570 VHN at 20 micrometer from the surface to about 880 VHN in a transition zone comprising both borides and iron phases.

CVD diamond deposition is carried out in a Hot-Filament CVD reactor. The substrate temperature is kept at about 650° C., the temperature of the filament is kept at about 2100° C. and the distance between the filament and the substrate is kept at about 10 mm. During the first 15 minutes of the CVD diamond deposition process a gas mixture of 1% methane in hydrogen is used. After these first 15 minutes a gas mixture 0.5% methane in hydrogen is used. The CVD diamond deposition process is carried out for about 4 hours, after which the substrate is cooled down with a cooling rate of 20° C. per minute. SEM observations show on the substrate a uniform, homogeneous and adherent diamond film. Faceted diamond crystallites with a few twin structures were observed. The crystallite size of the diamond film was approximately 2–3 μm. The diamond grains are well-facetted. Raman peaks are observed at about 1335 cm$^{-1}$, corresponding to a residual stress of less than 2 GPa.

EXAMPLE 2

An AISI 316 steel substrate with a matrix Vickers hardness of 260 is boronized by a packed boronizing process. Hereto is a mixture of boron carbide, silicon carbide and potassium fluorocarbide used. Boronizing is carried out at a temperature of 950° C. for 1 hour and alternated by annealing for about 15 minutes at a temperature of about 600° C.–650° C. where the diffusivity of boron is very low as compared to interstitials such as carbon. This cycle of boronizing and annealing is carried out four times after which the austenitic steel substrate is cooled down in air.

X-ray diffraction investigations show the presence of significant amounts of FeB, Fe$_2$B and Cr$_5$B$_3$ phases. SEM investigations show the presence of an outer layer of about 40–50 μm thick with layers of borides with planar growth interfaces. The Vickers hardness drops from about 3800 VHN at the surface of the boronized outer layer to about 1250 VHN at 20 micrometer from the surface to about 270 VHN close to the unaffected matrix of the steel. CVD diamond deposition is carried out in a Hot-Filament CVD reactor. The substrate temperature is kept at about 650° C., the temperature of the filament is kept at about 2100° C. and the distance between the filament and the substrate is kept at about 15 mm. The gas mixture during the CVD diamond deposition was of 0.5% methane in hydrogen.

Nanocrystalline so-called cauliflower diamond crystallites are formed. The diamond film is uniform and continuous. The crystallite sizes are found to be about 80–300 nm. The diamond grains are well-facetted, i.e. little to no twinning is observed. Raman spectroscopy shows the good quality and low residual stress of the deposited diamond film.

EXAMPLE 3

Two block-shaped AISI type 316 stainless and two tool steel samples of dimensions 21×14×6 mm$^3$, are used as substrates. The tool steel (H11) samples contain 0.42 wt. % C, 4.47 wt. % Cr, 1.13 wt. % Mo, 0.13 wt. % W, 0.34 wt. % V and balance Fe, whereas the AISI type 316 stainless steel samples contain 0.78 wt. % C, 16.90 wt. % Cr, 2.00 wt. % Mo, 10.60 wt. % Ni, 1.78 wt. %, 0.07 wt. % V and balance Fe. These steel samples are borided by means of a pack boriding process using an interrupted treatment. For a first set of an AISI type 316 stainless steel sample and a tool steel sample a mixture of 8% boron carbide (B$_4$C), 5% alumina (Al$_2$O$_3$), 5% potassium fluoroborate (KBF$_4$) and 82–85% silicon carbide (SiC) is used. For a second set of an AISI type 316 stainless sample and a tool steel sample a mixture of 5% boron carbide (B$_4$C), 5% alumina (Al$_2$O$_3$), 5% potasium fluoroborate (KBF$_4$) and 82–85% silicon carbide (SiC) is used. Boriding is carried out at a temperature of 950° C. for 1 hour and alternated by annealing for about 15 minutes at a temperature of 650° C. The cycle of boriding and annealing is applied four times to result in a cumulative boriding time period at 950° C. of 4 hrs, after which the steels are cooled down in air. Cross-sectional metallographic analysis is performed to study the borided case thicknesses and structures. Vickers harness profiles along the boron diffusion direction are determined using a Mitutoyo micro hardness tester. FIG. 1 shows typical microhardners profiles of the as boronized samples.

Before diamond deposition, the borided block-shaped steel specimens are spark eroded into smaller parts (7×7×3 mm$^2$), carefully polished with a glycerol/diamond paste and ultrasonically abraded with diamond powder (1–2 μm) in an isopropanol emulsion. Diamond deposition is performed in a conventional hot-filament-assisted C\7D reactor. Diamond deposition is carried out utilizing a fixed CH$_4$:H$_2$ volume ratio of 0.5% at substrate temperatures between 520° C. and 650° C. and for four hours. For all deposition runs, the total pressure is kept at about 50 mbar and the total flow rate at 200 standard cm$^3$ min$^{-1}$. The TaC filament temperature is kept constant at 2130±20° C. as measured with an optical pyrometer.

Boriding carried out on the tool steel sample and the AISI type 316 stainless steel sample using 8% B$_4$C resulted in the formation of both the FeB en Fe$_2$B phases. The thickness of these boronized layers on these samples was about 40–50 microns. Boriding carried out on the tool steel sample and the AISI type 316 stainless steel sample using 5% B$_4$C resulted in the formation of an outer layer in which FeB could not be detected. The thickness of the boronized layers was about 40–50 microns.

The diamond coating as found on each of the samples of the first set showed thermal stresses of around 8 GPa as determined from Raman spectroscopy analysis. The diamond coating as found on each of the samples of the second set showed thermal stresses of around 1.4 GPa as also determined from Raman spectroscopy analysis.

FIG. 2a–2c shows X-ray diffraction patterns taken of: an untreated substrate (FIG. 2a); an as-boronized substrate (FIG. 2b); and of an as-borided substrate on top of which a CVD diamond coating was deposited (FIG. 2c).

What is claimed is:

1. A method of forming a diamond coating on an iron-based substrate, comprising:
   providing an iron-based substrate with an outer layer which substantially comprises metal borides, wherein said outer layer is formed by boronizing said iron-based substrate; and
   depositing the diamond coating on the outer layer using a process of Chemical Vapor Deposition (CVD).

2. The method according to claim 1, wherein said metal borides comprise substantially iron borides.

3. The method according to claim 1, wherein a surface of the outer layer comprises Fe$_2$B and is substantially free from FeB.

4. The method according to claim 3, wherein the outer layer is substantially free of FeB.

5. The method according to claim 4, wherein the boronizing is carried out at a relatively high temperature at which the iron-based substrate comprises a stable austenite phase.

6. The method according to claim 5, wherein the boronizing is alternated with annealing.

7. The method according to claim 3, wherein the boronizing is carried out at a relatively high temperature at which the iron-based substrate comprises a stable austenite phase.

8. The method according to claim 7, wherein the boronizing is alternated with annealing.

9. The method according to claim 1, wherein the boronizing is carried out at a relatively high temperature at which the iron-based substrate comprises a stable austenite phase.

10. The method according to claim 9, wherein the boronizing is alternated by annealing.

11. The method according to claim 1, further comprising:
heating said iron-based substrate which comprises subjecting the outer layer to an elevated temperature that is within a range of about 135° C. to about 1200° C.;
exposing said iron-based substrate which comprises subjecting the outer layer to a gas mixture containing a carbonaceous gas; and
activating said gas mixture.

12. The method according to claim 11, wherein said gas mixture comprises initially an excess of carbonaceous gas to allow for a reduction of an incubation time for nucleation of diamond crystallites.

13. The method according to claim 1, further comprising after depositing the diamond coating on the outer layer a step of controlled cooling down the iron-based substrate with the outer layer and the diamond coating at a controlled cooling rate which is slower than the cooling rate obtained by uncontrolled cooling.

14. The method according to claim 1, comprising prior to depositing the diamond coating mechanically scratching said outer layer.

15. A method of hosting CVD diamond coating, comprising using an iron-based substrate for hosting a CVD diamond coating, wherein said iron-based substrate comprises an outer layer which substantially comprises metal borides formed by boronizing said iron-based substrate.

16. The method according to claim 15, wherein the boronizing is carried out at a relatively high temperature at which the iron-based substrate comprises a stable austenite phase.

17. The method according to claim 16, wherein the boronizing is alternated with annealing.

18. A method of adhering a diamond coating onto an iron-based substrate, said method comprising:
boronizing an iron-based substrate to form an outer layer which substantially comprises metal boride; and
depositing a diamond coating on the outer layer by chemical vapor deposition.

* * * * *